(12) United States Patent
Lee

(10) Patent No.: US 6,963,941 B1
(45) Date of Patent: Nov. 8, 2005

(54) HIGH SPEED BUS TOPOLOGY FOR EXPANDABLE SYSTEMS

(75) Inventor: Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 892 days.

(21) Appl. No.: 09/583,883

(22) Filed: May 31, 2000

(51) Int. Cl.$^7$ .............................................. G06F 13/00
(52) U.S. Cl. ........................ 710/107; 361/775; 361/788
(58) Field of Search ........................... 710/2, 301–304, 710/200, 107; 309/9, 250; 370/255, 362, 370/466, 35.4; 439/61; 361/788, 775–778, 361/796–797, 360, 63, 364, 735; 365/63

(56) References Cited

U.S. PATENT DOCUMENTS

| | | | |
|---|---|---|---|
| 4,954,949 A | | 9/1990 | Rubin |
| 5,130,894 A | * | 7/1992 | Miller .......................... 361/735 |
| 5,355,391 A | | 10/1994 | Horowitz et al. |
| 5,517,623 A | * | 5/1996 | Farrell et al. ................ 710/300 |
| 5,530,623 A | * | 6/1996 | Sanwo et al. ................ 361/788 |
| 5,536,176 A | * | 7/1996 | Borchew et al. .............. 439/61 |
| 5,548,734 A | | 8/1996 | Kolinski et al. |
| 5,578,940 A | | 11/1996 | Dillon et al. |
| 5,781,747 A | | 7/1998 | Smith et al. |
| 5,835,784 A | * | 11/1998 | Gillespie et al. .............. 710/10 |
| 5,922,077 A | * | 7/1999 | Espy et al. ..................... 714/7 |
| 5,930,496 A | | 7/1999 | MacLaren et al. |
| 5,935,233 A | | 8/1999 | Jeddeloh |
| 5,961,618 A | | 10/1999 | Kim |
| 5,986,880 A | * | 11/1999 | Santeler et al. ............. 361/684 |
| 6,023,147 A | * | 2/2000 | Cargin et al. ................. 33/473 |
| 6,144,576 A | * | 11/2000 | Leddige et al. ............... 365/63 |
| 6,172,895 B1 | * | 1/2001 | Brown et al. ................. 365/63 |
| 6,202,008 B1 | * | 3/2001 | Beckert et al. ............... 701/33 |
| 6,219,733 B1 | * | 4/2001 | Appel et al. ................ 710/301 |
| 6,285,398 B1 | * | 9/2001 | Shinsky et al. .......... 348/223.1 |
| 6,491,526 B2 | * | 12/2002 | Leman ........................ 439/61 |
| 6,535,396 B1 | * | 3/2003 | Degenkolb et al. ......... 361/775 |
| 6,545,875 B1 | * | 4/2003 | Perino et al. ............... 361/760 |
| 6,738,856 B1 | * | 5/2004 | Milley et al. ............... 710/315 |
| 2002/0073257 A1 | * | 6/2002 | Beukema et al. ........... 710/105 |
| 2003/0014569 A1 | * | 1/2003 | Kim .............................. 710/9 |

OTHER PUBLICATIONS

Handbook of Lan Cable Testing, Bob Hoagland, 1st edition Sep. 1992.*

* cited by examiner

Primary Examiner—Tim Vo
Assistant Examiner—Kim T. Huynh
(74) Attorney, Agent, or Firm—Dickstein Shapiro Morin & Oshinsky LLP

(57) ABSTRACT

A high-speed short-loop bus topology that routes the bus into a first expansion connector and out of a first expansion card inserted within the connector is disclosed. The bus is not routed out of the first expansion connector. Instead, the bus is routed from the first expansion card into a second expansion card by a jumper mechanism. The bus is routed through the second expansion card and out of a second expansion connector housing the second expansion card, where the bus can be terminated or routed into another expansion connector having another expansion card. By routing the bus in this manner, it is shorter than prior art buses found in loop-through bus systems and capable of substantially maintaining a uniform transmission line impedance. Moreover, the operating bandwidth of the short-loop bus is increased since the bus is short and does not have stubs or signal reflections.

62 Claims, 9 Drawing Sheets

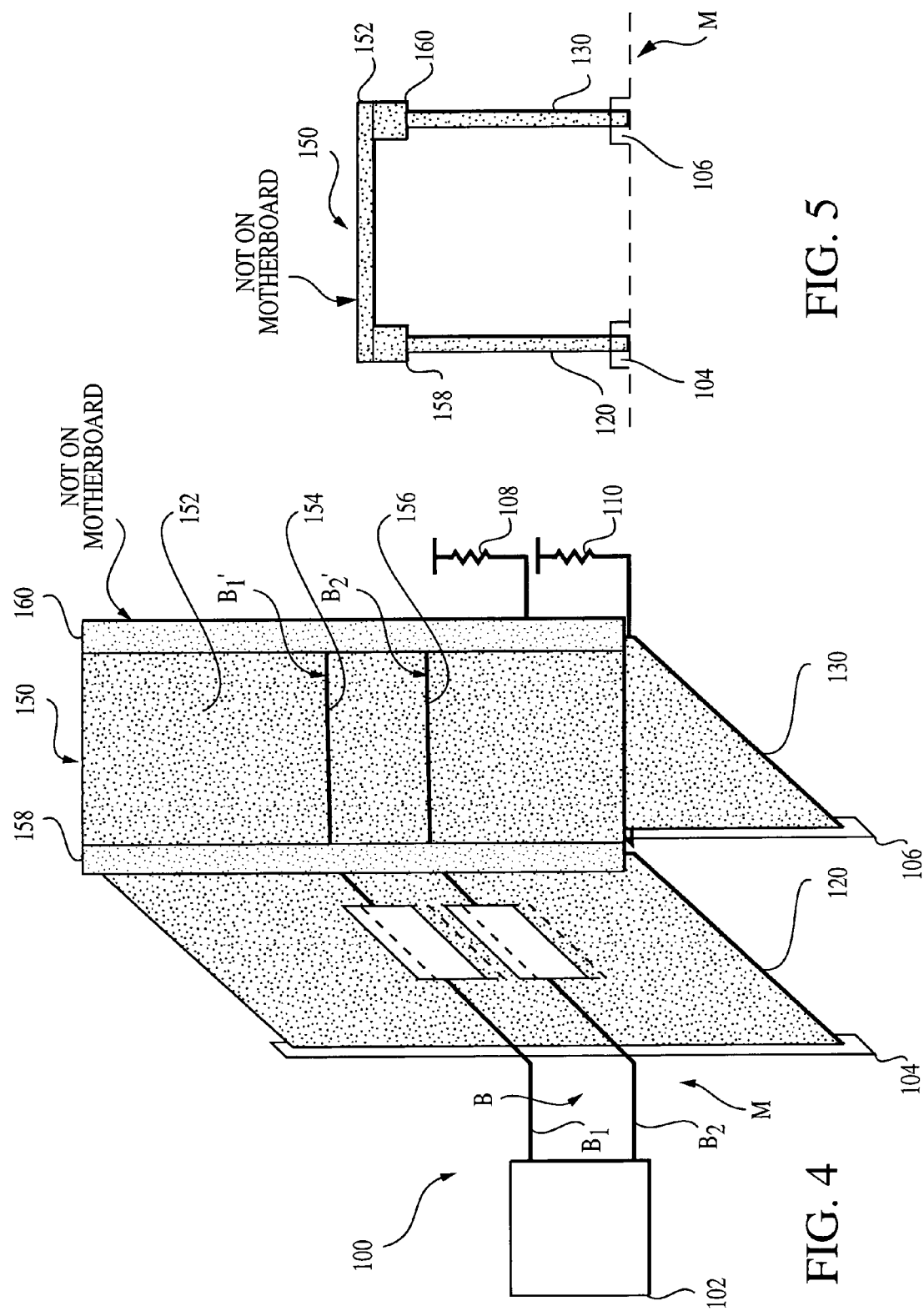

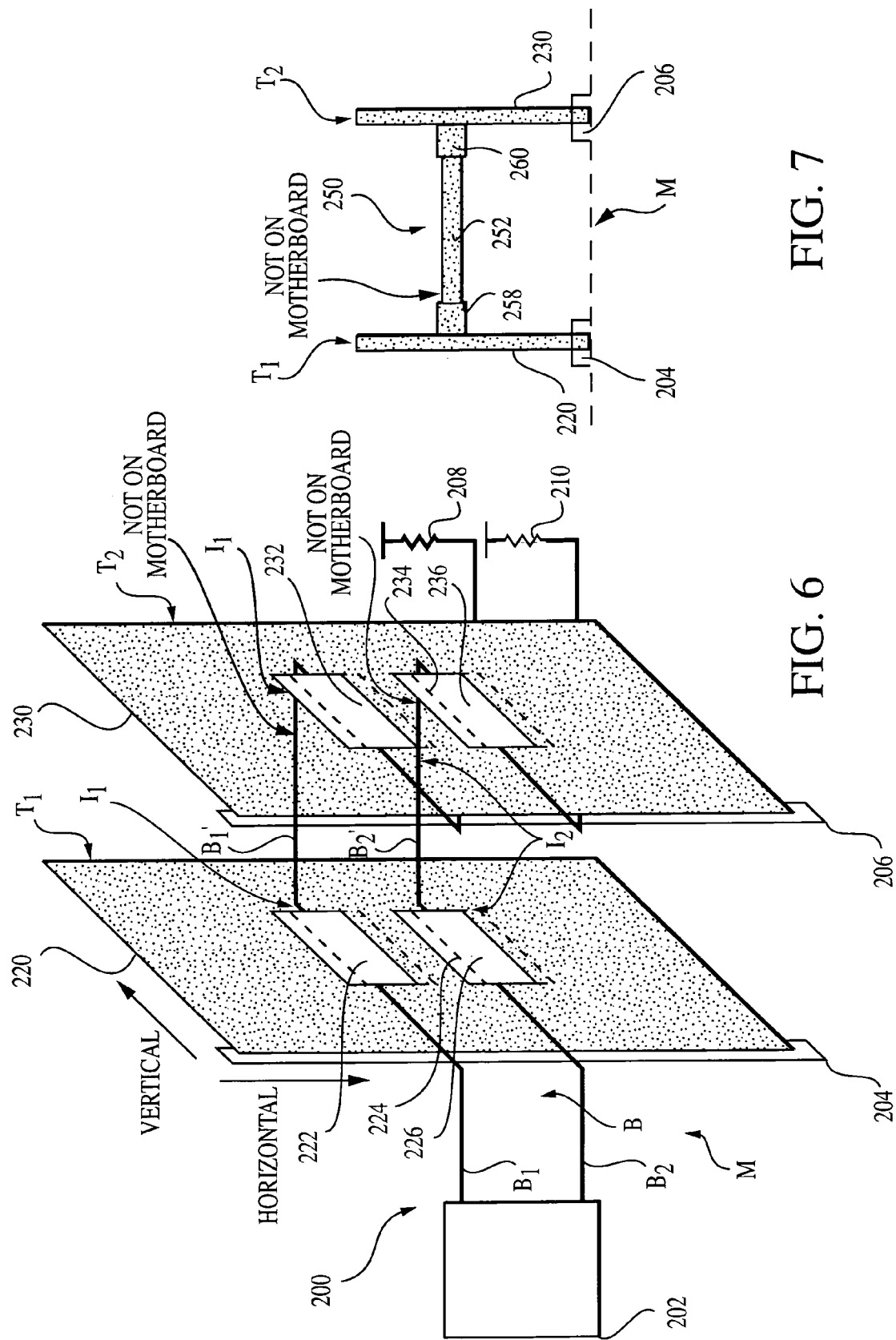

HIGH SPEED BUS TOPOLOGY FOR EXPANDABLE SYSTEMS

BACKGROUND OF THE INVENTION

1. Field of the Invention

The present invention relates to the field of computer systems and, more particularly to a high speed bus topology for expandable computer systems.

2. Description of the Related Art

Today's computer and network systems require the ability to expand their hardware over time to improve their performance or to accommodate new users. Expansion capabilities are typically provided for graphics, input/output (I/O), network interface, microprocessors, static random access memory (SRAM) and dynamic random access memory (DRAM) circuit cards. These expansion cards are typically integrated on a printed circuit board (PCB) that can easily be inserted or removed by a user of the system. The PCB is inserted into a connector, which provides an electrical connection to a bus.

The expandable bus is typically located on a host PCB, often referred to as a motherboard. Connectors are mounted on the motherboard to provide slots for hardware expansion. The bus connects to the expansion card through the connector. Expansion cards are also known as add-in cards. This connection typically results in a branch off the main bus to the receiving components on the expansion card. This branch is commonly referred to as a stub connection. The stubs are electrically undesirable for high-speed buses, since they provide a discontinuity of impedance along the bus, which results in reflected energy on the bus.

One technique that has been used to reduce the effect of stubs on the bus includes the use of series resistors on the add-in cards. This technique isolates the stubs from the main bus and the resistors help dissipate the energy of the reflected waves travelling within the stub. FIG. 1 illustrates a conventional high speed bus system 10, typically used in network switches, hubs and computer systems, utilizing the series resistor technique. This system 10 is often referred to as a stub bus system. For the purposes of this discussion, the system 10 will represent a computer main memory subsystem. It should be noted that this is just an example and that the same system 10 is appropriate for any high-speed bus having removable circuit cards.

The system 10 includes two circuit cards 30, 40 that are attached to bus lines $B_1$, $B_2$, $B_3$, $B_4$ through connectors 14, 16, respectively. The point where the bus lines $B_1$, $B_2$, $B_3$, $B_4$ branch off into the connectors are the stub connection points $S_1$, $S_2$, $S_3$, $S_4$, $S_5$, $S_6$, $S_7$, $S_8$ (collectively referred to herein as stub connections S). The bus lines $B_1$, $B_2$, $B_3$, $B_4$ may comprise the main computer bus B for the system 10 or a sub-bus. Each bus line $B_1$, $B_2$, $B_3$, $B_4$ may be a 16-bit wide bus line, making the bus B a 64-bit bus. A memory controller 12 is connected to the bus lines $B_1$, $B_2$, $B_3$, $B_4$ and manages data flow on the bus B. The controller 12, bus lines $B_1$, $B_2$, $B_3$, $B_4$ and connectors 14, 16 all reside on the computer motherboard M. The circuit cards 30, 40 contain circuit elements 32, 42, respectively, which for this example are memory chips. Each bus line $B_1$, $B_2$, $B_3$, $B_4$ is terminated by termination resistors 20, 22, 24, 26, respectively.

In the present example, each connector 30, 40 (also referred to as a slot) is provided for increasing the memory storage capacity of the system 10. Although only two connectors 14, 16 are illustrated, there can be any number of connectors 14, 16. Typically, the number of slots will be determined by the maximum bus B operating frequency or by the maximum desired memory capacity. In the present example, the connectors 14, 16 can be 184-pin dual in-line memory module (DIMM) connectors and the cards 30, 40 can be double data rate (DDR) synchronous DRAM (SDRAM) modules.

The termination resistors 20, 22, 24, 26 are provided for high-speed signal termination of the bus B. Each resistor 20, 22, 24, 26 has a value that is normally chosen to be equal to the loaded characteristic impedance of the bus system 10. Termination of the bus B prevents signal reflections that result from a mismatch in impedance at the end of the bus B.

Series or stub resistors 34, 44 are included in each card 30, 40, respectively, at a point near the interface to the connectors 14, 26 (i.e., near the stub points $S_1$, $S_2$, $S_3$, $S_4$, $S_5$, $S_6$, $S_7$, $S_8$). The stub resistors 34, 44 serve two purposes related to improving the signal integrity and increasing the bandwidth of the system 10. First, the resistors 34, 44 help increase the impedance of the stub connections and therefore, isolate the stubs from the main motherboard bus. Second, the resistors 34, 44 help attenuate the reflected energy that travels up and down the stubs from the motherboard to the main memory bus.

The use of stub resistors 34, 44 is quite effective for reducing reflections and improving the operating bandwidth, but there are some drawbacks. There is some added system cost and module layout complexity associated with the large number of resistors. In a DDR SDRAM DIMM, for example, the data bus width can be 64 or 72 bits wide. Since there is termination at the end of the bus, there becomes a DC path for current from the DRAM driving the bus, through the stub resistor, into a parallel resistor and into a termination voltage (typically referred to as VTT). The stub resistor reduces the voltage swing of the signal on the bus, so it is necessary to reduce the driver impedance or to increase the output driver supply voltage on the DRAM (typically referred to as VDDQ). Reducing the drive impedance requires a larger device, which increases the input/output capacitance of the DRAM. The higher capacitance has the effect of reducing bus bandwidth, so typically, a larger VDDQ is used to increase the voltage swing to the appropriate level.

Another technique to reduce the effects of stubs on the bus is to remove the stub connection points. FIG. 2 illustrates a system 50 where the bus B is looped through a connector 54, circuit card 60 and then back out the same connector 54. The bus B is then looped through a second connector 56, circuit card 70 and then back out the same connector 56 where it is terminated by a termination resistor 58. This system 50 is often referred to as a loop-through bus system. Keeping with the above example illustrated in FIG. 1, the system 50 is a computer main memory subsystem. The system includes a memory controller 52 that is mounted on the computer motherboard M along with the bus B, connectors 54, 56 and resistor 58. Each card 60, 70 contains circuit elements 62, 72, respectively, which for this example are memory chips. The bus B may be a 16-bit bus.

By eliminating the stub connections, the loop-through bus system improves the operating bandwidth, provided that a uniform transmission line impedance is maintained throughout all sections of the bus B. This requires that the impedance of the connectors 54, 56 match the bus trace impedance. It also means that the sections of the cards 60, 70 that are populated by the elements 62, 72 must have the same loaded characteristic impedance as sections without the elements 62, 72. A typical motherboard PCB bus line impedance will be around 60 ohms for a minimum width line. However, in the section where the DRAM devices are located, there is an increase in capacitance per unit length due to the DRAM input capacitance. Therefore, the effective impedance of the bus is reduced.

In the populated section of the card, a loaded impedance of 25 to 30 ohms is typical. In order to achieve a uniform bus impedance, it is necessary to increase the line widths of the bus in the unpopulated sections so that its impedance is equal to the impedance of the populated sections. This layout restriction becomes impractical for larger bus widths due to the congestion of the bus and due to the amount of board surface area that the bus uses. Further, the lower bus impedance requires a lower termination resistance, which dissipates more power for a given signal voltage swing.

Another disadvantage of the loop-through system 50 is that the bus length gets very long. The longer bus length results in an increase in propagation delay from when the controller 52 drives the bus B until the information is received at the elements 62, 72 (a DRAM element in this example). This is often referred to as flight time. The longer flight time increases the latency from when the controller 52 requests information until the information is received at the controller 52. The increased latency reduces the computer system performance. Longer flight times can also reduce the efficiency of the bus B for moving information. Typically, there is a brief waiting period that occurs between one device releasing the bus B and a different device driving the bus B. The waiting period is necessary to allow the data to propagate to one end of the bus and/or to allow the bus voltage to settle to a stable state. In the case of a DRAM element 62, 72 (hereinafter referred to as a "DRAM element") driving the bus B followed by the controller 52 driving the bus B, the controller 52 must wait until the previous data is received at the controller 52 before it turns on its driver. Otherwise, the data will be corrupted.

A similar waiting period can occur when one DRAM element releases the bus B before another DRAM element drives the bus B. If there is an existing voltage waveform propagating on the bus B this situation can result in excessively high or low voltages on the bus B when the second DRAM element drives it. Since it is not practical to for the bus B to maintain a perfectly uniform impedance, there will also be some reflected energy travelling along the bus B. If the bus B voltage is not in a stable state when the next DRAM element drives it, the transition time of the signal moving through the reference voltage will be adversely effected. This results in an increase or decrease in the delay of the recognition of a logical one or zero voltage. This delay change results in timing uncertainty or timing errors, which can corrupt the data that is latched into the receiving device. This is a form of inter-symbol interference where the previous data value can effect the capture of the next data bit or symbol.

Another disadvantage of the long bus B of the loop-through bus system 50 is a reduction in maximum operating bandwidth. Since the bus B is not physically ideal, there is attenuation and dielectric leakage in the PCB. These losses result in a reduction of signal swing and get worse at higher frequencies. Since there also is reflected energy travelling along the bus B, the rate at which data can be transmitted on the bus B becomes limited.

A further disadvantage of the loop-through bus system 50 is that its long bus B can increase the electromagnetic interference (EMI) of the system 50. EMI increases as the cross-sectional area of a signal and its ground return path are increased. In the current example, a signal transmitted from the controller 52 will travel down the bus B. The signal's electromagnetic wave return path will predominately be along the ground plane located under the signal. In a personal computer (PC) system, the memory cards are typically 5.25 inches wide by 1.25 inches tall. This means that the length of the bus routed through the memory card is over 6 inches. For a three card system, the total bus length can be over 20 inches. This provides ample opportunities for EMI and signal attenuation.

Accordingly, there is a desire and need for a high-speed bus topology for expandable computer systems that provides a relatively shorter bus having a substantially greater operating bandwidth of the bus while maintaining a uniform transmission line impedance.

SUMMARY OF THE INVENTION

The present invention provides a high-speed bus topology for expandable computer systems that provides a shorter bus than prior art systems.

The present invention provides a high-speed bus topology for expandable systems having a bus with a substantially greater operating bandwidth.

The present invention also provides a high-speed bus topology for expandable systems having a bus with a substantially uniform transmission line impedance.

The above and other features and advantages of the invention are achieved by a high-speed short-loop bus topology that routes the bus into a first expansion connector and out of a first expansion card inserted within the connector. The bus is not routed out of the first expansion connector. Instead, the bus is routed from the first expansion card into a second expansion card by a jumper mechanism. The bus is routed through the second expansion card and out of a second expansion connector housing the second expansion card, where the bus can be terminated or routed into another expansion connector having another expansion card. By routing the bus in this manner, it is shorter than prior art buses found in loop-through bus systems and capable of substantially maintaining a uniform transmission line impedance. Moreover, the operating bandwidth of the short-loop bus is increased since the bus is short and does not have stubs or signal reflections.

The above and other features and advantages of the invention are also achieved by a high-speed short-loop up/down bus topology that routes the bus into a first expansion connector and through a first expansion card inserted within the connector in a substantially vertical manner. The routing from the connector to a device on the card and back out the connector uses a relatively short and substantially vertical path, which reduces bus length while overcoming many of the shortcomings of today's bus topologies. In addition, the input and output pins for the bus may be on different sides of the connector.

BRIEF DESCRIPTION OF THE DRAWINGS

The foregoing and other advantages and features of the invention will become more apparent from the detailed description of the preferred embodiments of the invention given below with reference to the accompanying drawings in which:

FIG. 4 is a circuit diagram illustrating the exemplary high speed bus topology of FIG. 3 with an exemplary jumper mechanism installed thereon;

FIG. 5 is a side view of the circuit cards connected by the jumper illustrated in FIG. 4;

FIG. 6 is a diagram illustrating another exemplary high speed bus topology constructed in accordance with another embodiment of the present invention;

FIG. 7 is a side view of the circuit cards illustrated in FIG. 6 connected by a jumper;

DETAILED DESCRIPTION OF PREFERRED EMBODIMENTS

Figure 1:
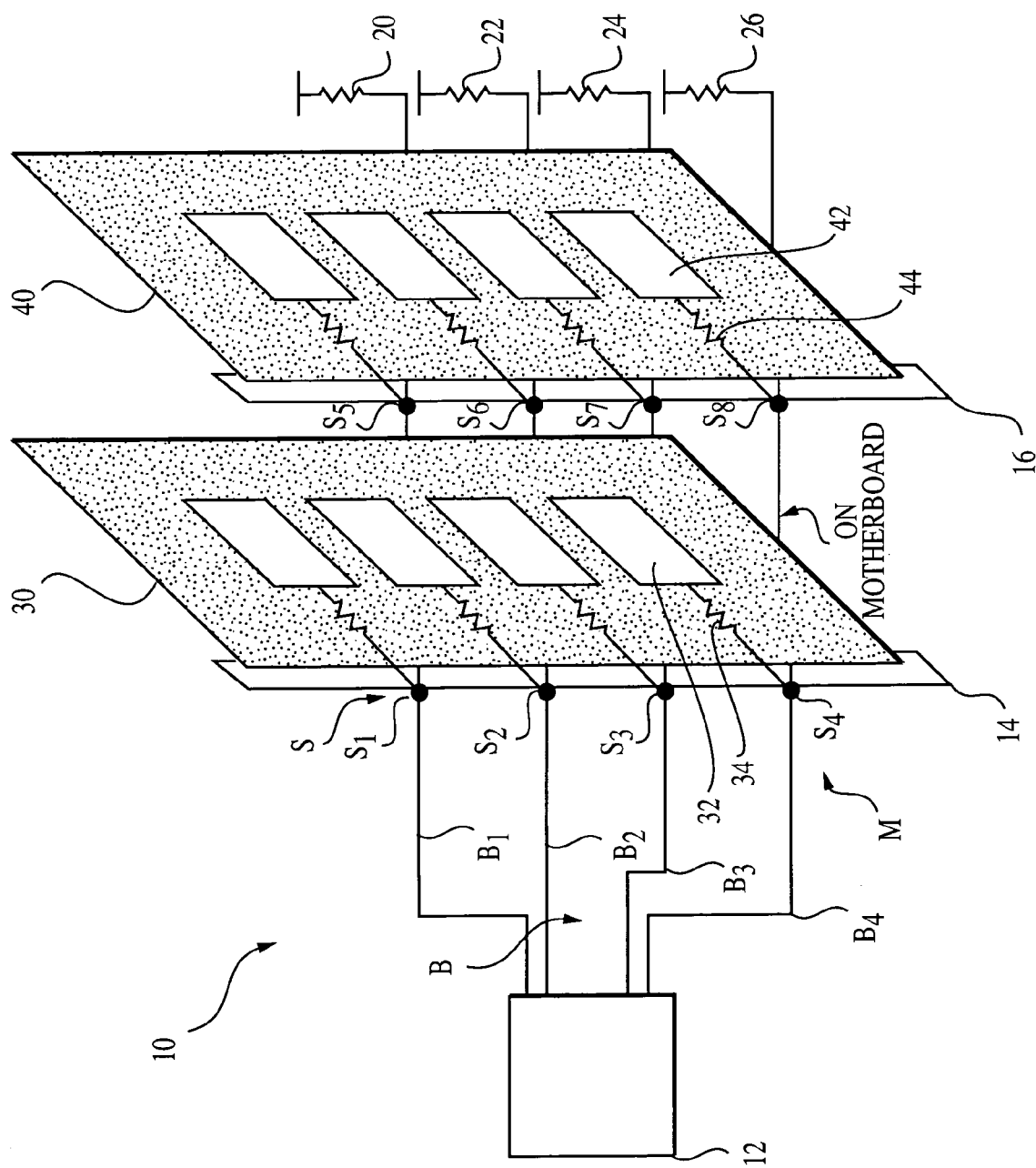
FIG. 1 is a diagram illustrating an exemplary prior art stub bus topology.

The present invention will be described as set forth in the preferred embodiments illustrated in FIGS. 3–11. Other embodiments may be utilized and structural or logical changes may be made without departing from the spirit or scope of the present invention. Like items are referred to by like reference numerals.

Figure 2:
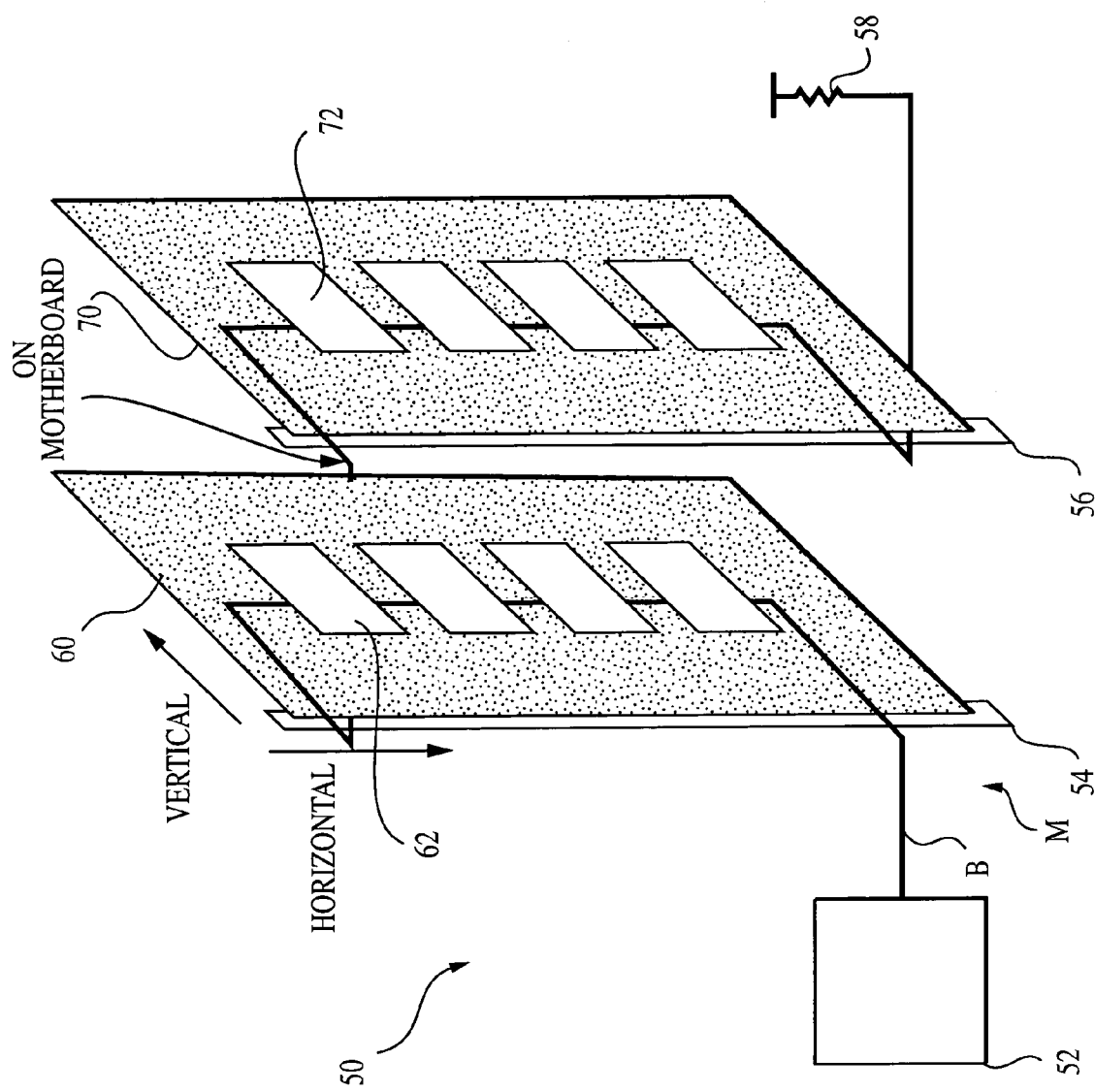
FIG. 2 is a diagram illustrating an exemplary prior art loop-through bus topology.
Figure 3:
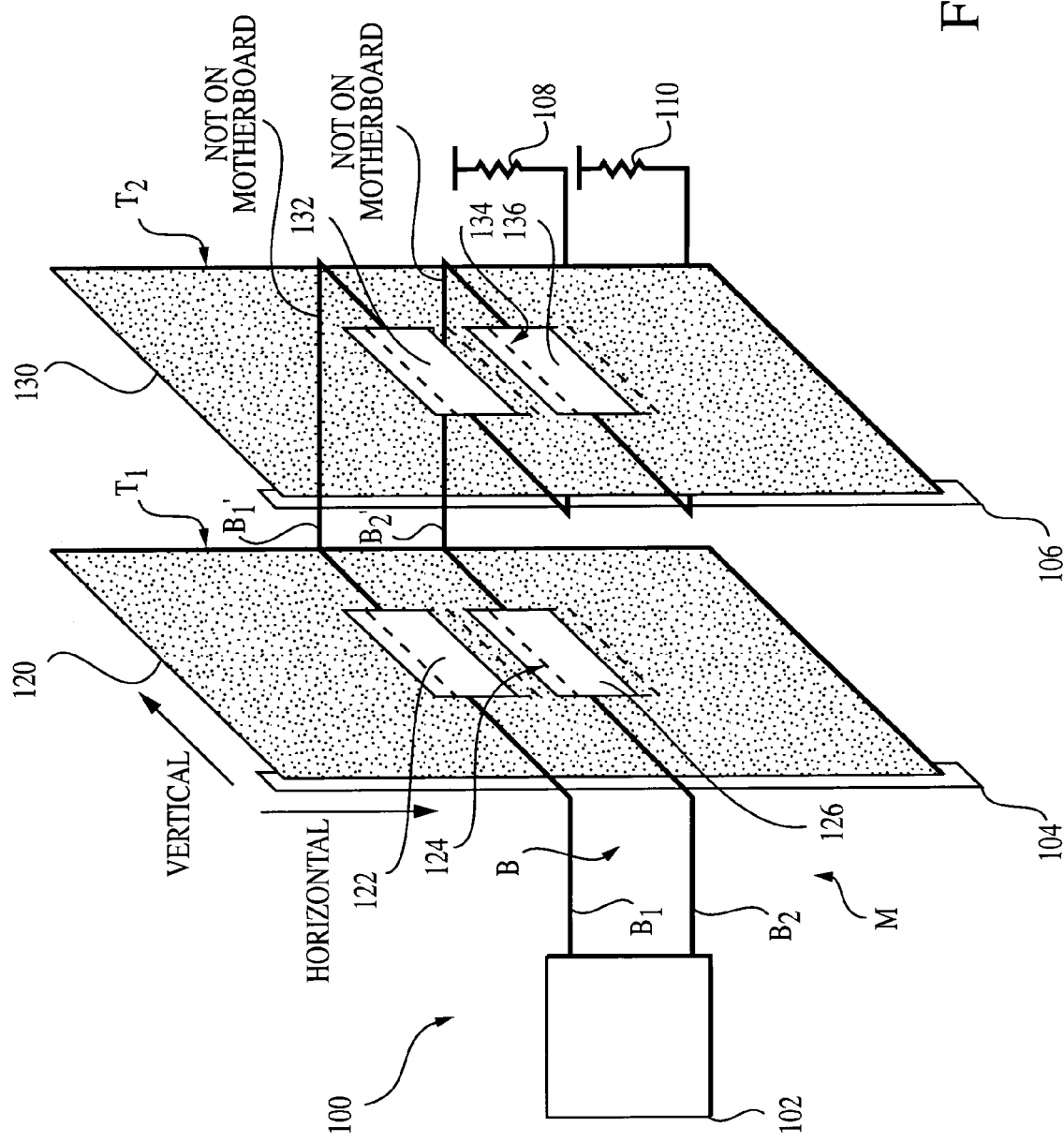
FIG. 3 is a diagram illustrating an exemplary high speed bus topology constructed in accordance with an embodiment of the present invention.

Referring to FIG. 3, a short-loop bus system 100 constructed in accordance with the present invention is illustrated. In keeping with the example used to described the prior art systems 10, 50 (FIGS. 1 and 2, respectively), the system 100 will be described as a computer main memory subsystem. It should be noted that this is just an example and that the same system 100 is appropriate for any high-speed bus having removable circuit cards.

The system 100 includes two circuit cards 120, 130 that are attached to bus lines $B_1$, $B_2$ through connectors 104, 106, respectively. Similar to the loop-through bus system 50 (FIG. 2), there are no stub connection points in the system 100. The bus lines $B_1$, $B_2$ may comprise the main computer bus B for the system 100 or a bus subsystem. The bus B carries address, data, control, power and ground signals as well as any reference signals required by the system 100. For purposes of a simplified description, each bus line $B_1$, $B_2$ is 16-bit wide bus line, making the bus B a 32-bit bus. Although this is merely exemplary and other bus bit-widths may be used. A memory controller 102 is connected to the bus lines $B_1$, $B_2$ also. The controller 102 and connectors 104, 106 reside on the computer motherboard M. With the exception of the bus portions designated as $B_1'$, $B_2'$, the bus lines $B_1$, $B_2$ are also provided on the motherboard M. As will be described below, it is desirable for the bus portions $B_1'$, $B_2'$ to be provided by a jumper mechanism connected to the tops $T_1$, $T_2$ of the cards 120, 130, respectively. Bus line $B_1$ is terminated by termination resistor 108 and bus line $B_2$ is terminated by termination resistor 110.

The first circuit card 120 contains circuit elements 122, 126. The first circuit card 120 can also contain additional circuit elements 124 (shown by dotted lines) mounted on a backside of the card 120. The second circuit card 130 contains circuit elements 132, 136. The second circuit card 130 can also contain additional circuit elements 134 (shown by dotted lines) mounted on a backside of the card 130. In keeping with our present example, the circuit elements 122, 124, 126, 132, 134, 136 are memory chips. It is desirable, however, that the circuit elements 122, 124, 126, 132, 134, 136 are memory chips, for example, DRAM, or SDRAM chips, and that the system 100 is a memory system with a high-speed bus B. Although only two connectors 104, 106 are illustrated, there can be any number of connectors 104, 106. Typically, the number of connector 104, 106 or expansion slots will be determined by the maximum bus B operating frequency or by the maximum desired memory capacity.

The termination resistors 108, 110 are provided for high-speed signal termination of the bus B. Each resistor 108, 110 has a value that is normally chosen to be equal to the loaded characteristic impedance of the bus system 100. Termination of the bus B prevents signal reflections that result from a mismatch in impedance at the end of the bus B.

In accordance with an embodiment of the present invention, the bus B is looped in through the first connector 104, but out of the first circuit card 120. It is important to note that the bus B is not being routed through the card 120 and out of the connector 104 as is done in the prior art. Instead, in this embodiment, the bus B is routed out of the top $T_1$ of the card 120 into the top $T_2$ of the second circuit card 130. Bus portions $B_1'$, $B_2'$ are used to route the bus B between the tops $T_1$, $T_2$ of cards 120, 130. Bus portions $B_1'$, $B_2'$ are provided by a jumper mechanism (describes in detail below with reference to FIGS. 4 and 5). The bus B is routed out of the second connector 106, where it is terminated by the termination resistors 108, 110.

Figure 9:
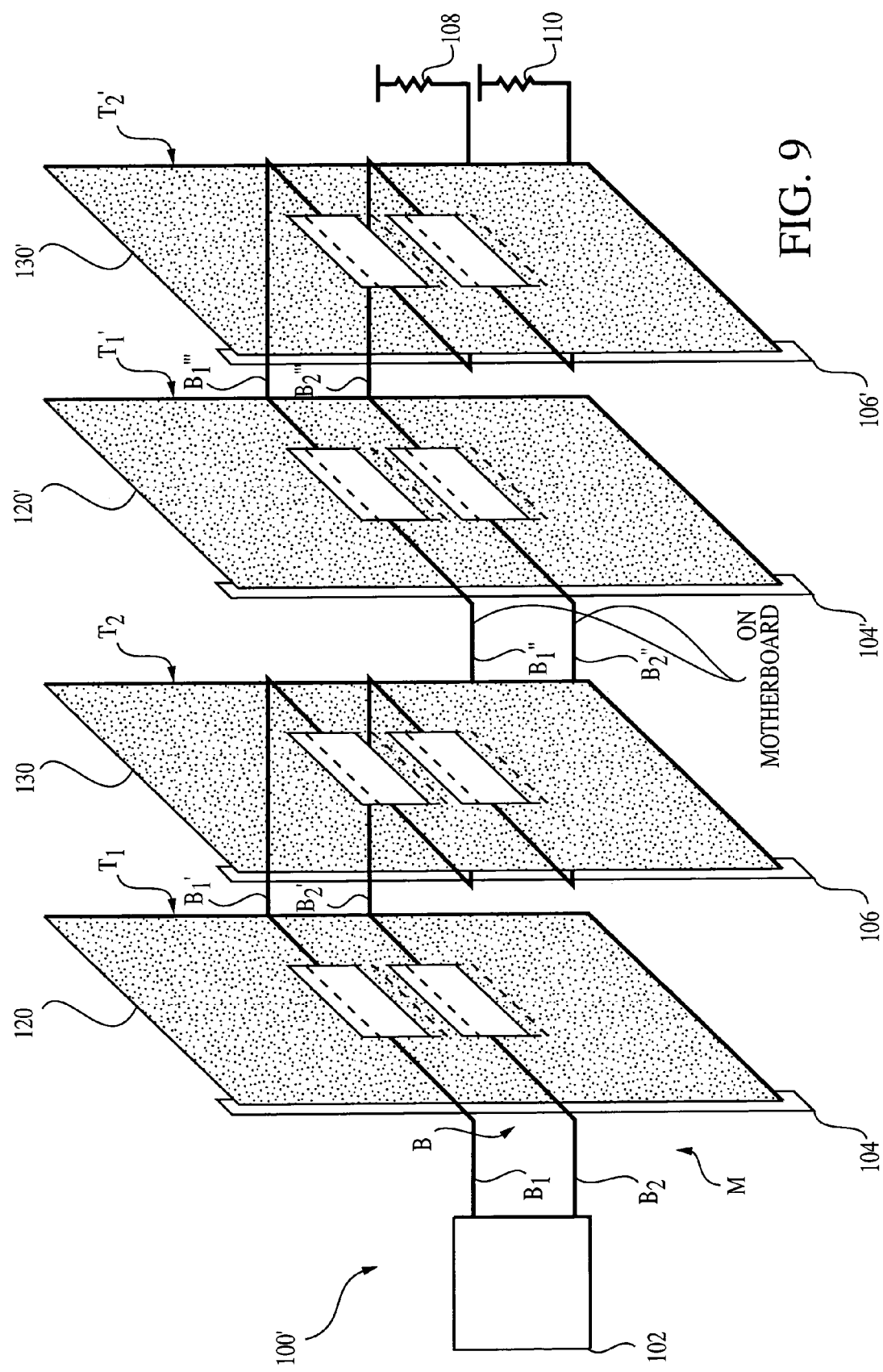
FIG. 9 is a diagram illustrating another exemplary high speed bus topology constructed in accordance with another embodiment of the present invention.

FIG. 9 illustrates a bus system 100' constructed in a similar manner as system 100 (FIG. 3) except that there are more expansion slots. The system 100' includes a third connector 104' and circuit card 120'. In accordance with the present invention, the bus B would be routed into the third connector 104' and out of a top $T_1'$ of the card 120' in a similar manner as described with respect to the first circuit card 120. That is, there would be bus line portions $B_1''$ and $B_2''$ exiting the card 120', not the connector 104'. If the system 100' contained a fourth connector 106' and card 130', the bus B would be routed between the tops $T_1'$, $T_2'$ of the third and fourth cards 120', 130' and out of the fourth connector 106' in a similar manner as described with respect to the first and second cards 120, 130. There would be bus line portions $B_1'''$ and $B_2''$ exiting the card 120', not the connector 104' and entering the fourth card 130'. The bus B would then be routed through and out of the fourth card 130'. The routing of the bus B would continue in the same manner if there were other slots used in the systems 100, 100'.

Referring now to FIGS. 3–5, by being routed only once through each connector 104, 106, each bus line $B_1$, $B_2$ has only two connection points with the connectors 104, 106 as opposed to four in the loop-through system 50 (FIG. 2). This allows the use of a jumper mechanism 150 to route the bus vertically through the cards 120, 130 as opposed to the much longer horizontal routing performed in the loop-through system 50 (FIG. 2). In the system 100 of the present invention, the continuation of the bus (i.e., bus portions $B_1'$, $B_2'$) is maintained by a jumper mechanism 150 between the circuit cards 120, 130. In the loop-through system 50, the routing of the bus B is always continued on the motherboard M and the routing is always horizontal through the cards 60, 70.

Referring to FIGS. 4 and 5, the jumper mechanism 150 is now described. It is desirable that the jumper mechanism 150 be comprised of a PCB 152 having PCB traces 154, 156 (i.e., one for bus portion $B_1'$ and one for bus portion $B_2'$ of FIG. 3) and two connectors 158, 160. The traces 154, 156 and the connectors 158, 160 must be sized to match the impedance of the bus lines $B_1$, $B_2$ and configured to handle the connection between the cards 120, 130. It is desirable that the tops $T_1$, $T_2$ of the cards 120, 130 be "edge connectors" sized and configured to fit within the connectors 158, 160 of the jumper mechanism 150 or any other connecting mechanism used by the jumper mechanism 150. The jumper mechanism 150 is connected to the cards 120, 130 as shown in FIG. 5.

There are many other possibilities for implementing the jumper mechanism 150 that do not effect the applicability of the invention. For example, the jumper mechanism 150 could use a ribbon cable, flexible cable or coaxial cable instead of the PCB 152. All that is required is that the jumper mechanism 150 be capable of connecting to the cards 120, 130 and continuing the bus lines $B_1$, $B_2$. The actual choice is system dependent and can be based on such factors as cost and desired data rates of the application. It is also desirable that the jumper mechanism 150 match the impedance of the bus B.

FIG. 6 illustrates an alternate embodiment of the present invention. In keeping with the example used to described systems 10, 50 and 100 (FIGS. 1–3), the system 200 will be described as a computer main memory subsystem. It should be noted that this is just an example and that the same system 200 is appropriate for any high-speed bus having removable circuit cards.

The system 200 includes two circuit cards 220, 230 that are attached to bus lines $B_1$, $B_2$ through connectors 204, 206, respectively. Similar to the short-loop system 100 (FIG. 3), there are no stub connection points in the system 200. The bus lines $B_1$, $B_2$ comprise the main computer bus B for the system 200. The bus B may carry, e.g., address, data, control, power and ground signals as well as any reference signals required by the system 200. Each bus line $B_1$, $B_2$ is 16-bit bus, making the bus B a 32-bit bus. A memory controller 202 is connected to the bus lines $B_1$, $B_2$ also. The controller 202 and connectors 204, 206 reside on the computer motherboard M. With the exception of the bus portions designated as $B_1'$, $B_2'$, the bus lines $B_1$, $B_2$ are also provided on the motherboard M. As will be described below, it is desirable for the bus portions $B_1'$, $B_2'$ to be provided by a jumper mechanism connected to intermediate portions $I_1$, $I_2$ of the cards 220, 230, respectively. Bus line $B_1$ is terminated by termination resistor 208 and bus line $B_2$ is terminated by termination resistor 210.

The first circuit card 220 contains circuit elements 222, 226. The first circuit card 220 can also contain additional circuit elements 224 (shown by dotted lines) mounted on a backside of the card 220. The second circuit card 230 contains circuit elements 232, 236. The second circuit card 230 can also contain additional circuit elements 234 (shown by dotted lines) mounted on a backside of the card 230. In keeping with our present example, the circuit elements 222, 224, 226, 232, 234, 236 are memory chips. It is desirable, however, that the circuit elements 222, 224, 226, 232, 234, 236 are memory chips, such as DRAM or SDRAM, and that the system 200 is a computer memory system with a high-speed bus B. Although only two connectors 204, 206 are illustrated, there can be any number of connectors 204, 206. Typically, the number of connectors 204, 206 or expansion slots will be determined by the maximum bus B operating frequency or by the maximum desired memory capacity.

In accordance with this embodiment of the present invention, the bus B is looped in through the first connector 204, but out of the first circuit card 220. The bus B is routed out of intermediate portions $I_1$, $I_2$ of the card 220 into intermediate portions $I_1$, $I_2$ of the second circuit card 230. Bus portions $B_1'$, $B_2'$ are used to route the bus B between the intermediate portions $I_1$, $I_2$. Bus portions $B_1'$, $B_2'$ are provided by a jumper mechanism (describes in detail below with reference to FIG. 7). The bus B is routed out of the second connector 206, where it is terminated by the termination resistors 208, 210. If there was a third connector and circuit card, the bus would be routed into the third connector and out of the card in a similar manner as described with respect to the first circuit card 220. If the system 200 contained a fourth connector and card, the bus B would be routed between the tops of the third and fourth cards and out of the fourth connector in a similar manner as described with respect to the first and second cards 220, 230. The routing of the bus B would continue in the same manner for all other slots used in the system 200. It should be appreciated that the intermediate points $I_1$, $I_2$ would be useful in situations where the cards have a high height (i.e., greater than the average 1.25 inch height).

By being routed only once through each connector 204, 206, each bus line $B_1$, $B_2$ has only two connection points with the connectors 204, 206 as opposed to four in the loop-through system 50 (FIG. 2). This allows the use of a jumper mechanism 250 (FIG. 7) to route the bus vertically through the cards 220, 230 as opposed to the much longer horizontal routing performed in the loop-through system 50 (FIG. 2). In the system 200 of the present invention, the continuation of the bus (i.e., bus portions $B_1'$, $B_2'$) is maintained by a jumper mechanism 250 between the circuit cards 120, 130. In the loop-through system 50, the routing of the bus B is always continued on the motherboard M and the routing is always horizontal through the cards 60, 70.

Referring to FIG. 7, the jumper mechanism 250 is now described. It is desirable that the jumper mechanism 250 comprises a PCB 252 having PCB traces (i.e., one for bus portion $B_1'$ and one for bus portion $B_2'$ of FIG. 6) and two connectors 258, 260 position at opposite ends of the PCB 252. The traces and the connectors 258, 260 must be sized to match the impedance of the bus lines $B_1$, $B_2$ and configured to handle the connection between the cards 220, 230. It is desirable that the intermediate portions $I_1$, $I_2$ of the cards 220, 230 comprise connectors or projections sized and configured to fit within the connectors 258, 260 of the jumper mechanism 250 or any other connecting mechanism used by the jumper mechanism 250.

The new short-loop bus topologies constructed in accordance with the present invention will require a routed card in every expansion slot to maintain a continuous bus. This is also a requirement of the prior art loop-through system 50 (FIG. 2). If there is no active card in the expansion slot, a routing card must be inserted in its place. A bus jumper mechanism may also be necessary for the unpopulated slot. The topology of the present invention supports an even number of slots easily. An odd number of slots can be supported by providing a bus jumper mechanism that connects the top/intermediate second connector on the odd circuit card to the motherboard PCB.

Figure 10:
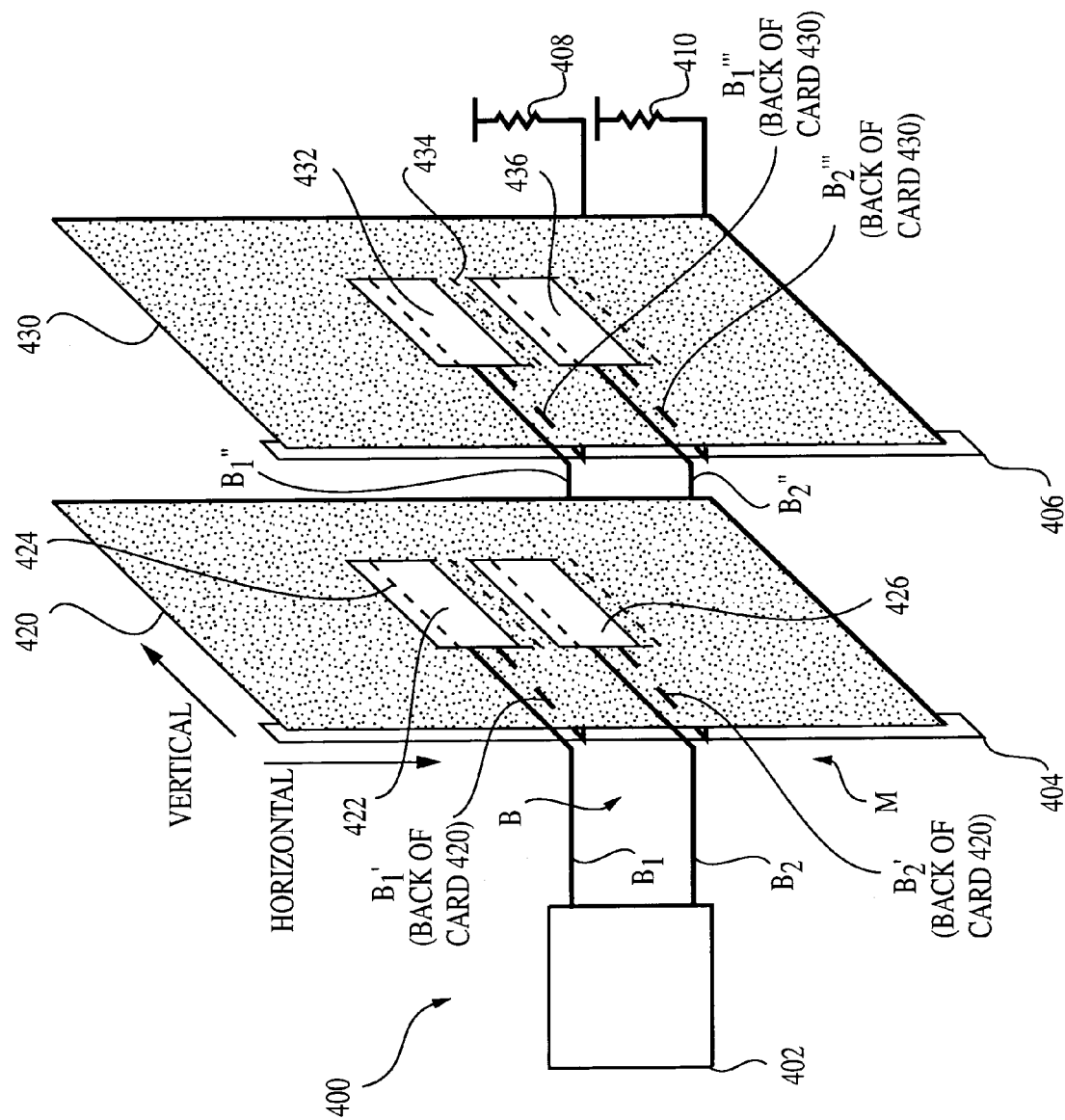
FIG. 10 is a diagram illustrating another exemplary high speed bus topology constructed in accordance with another embodiment of the present invention.

FIG. 10 illustrates another alternate embodiment of the present invention. This embodiment uses a substantially vertical short path bus routing technique to overcome the problems of the prior art and is referred to herein as a short-loop up/down topology. In keeping with the example used to described systems 10, 50 and 100 (FIGS. 1–3), the system 400 will be described as a computer main memory subsystem. It should be noted that this is just an example and that the same system 400 is appropriate for any high-speed bus having removable circuit cards.

The system 400 includes two circuit cards 420, 430 that are attached to bus lines $B_1$, $B_2$ through connectors 404, 406, respectively. Similar to the short-loop system 100 (FIG. 3), there are no stub connection points in the system 400. The bus lines $B_1$, $B_2$ comprise the main computer bus B for the system 400. The bus B may carry, e.g., address, data, control, power and ground signals as well as any reference signals required by the system 400. Each bus line $B_1$, $B_2$ may be a 16-bit bus, making the bus B a 32-bit bus. A memory controller 402 is connected to the bus lines $B_1$, $B_2$ also. The controller 402 and connectors 404, 406 reside on the computer motherboard M. With the exception of the bus portions routed through the cards 420, 430, designated as $B_1'$, $B_2'$, $B_1'''$, $B_2'''$, the bus lines $B_1$, $B_2$ are also provided on the motherboard M. Bus line $B_1$ is terminated by termination resistor 408 and bus line $B_2$ is terminated by termination resistor 410. Unlike the other embodiments of the present invention, the system 400 does not require a jumper mechanism to route the bus B between the circuit cards 420, 430 (described below).

The first circuit card 420 contains circuit elements 422, 426. The first circuit card 420 can also contain additional circuit elements 424 (shown by dotted lines) mounted on a backside of the card 420. The second circuit card 430 contains circuit elements 432, 436. The second circuit card 430 can also contain additional circuit elements 434 (shown by dotted lines) mounted on a backside of the card 430. In keeping with our present example, the circuit elements 422, 424, 426, 432, 434, 436 are memory chips. It is desirable, however, that the circuit elements 422, 424, 426, 432, 434, 436 are memory chips, such as DRAM or SDRAM, and that the system 400 is a computer memory system with a high-speed bus B. Although only two connectors 404, 406 are illustrated, there can be any number of connectors 404, 406. Typically, the number of connectors 404, 406 or expansion slots will be determined by the maximum bus B operating frequency or by the maximum desired memory capacity.

In accordance with this embodiment of the present invention, the bus B is routed into the first connector 404 to the devices 422, 424, 426. The bus B is then routed from the elements 422, 424, 426 to a different portion (i.e., different pins) of the first connector 404 and then out of the connector 404. Bus portions $B_1'$, $B_2'$ are used to route the bus in a substantially vertical manner from the elements 422, 424, 426 to the connector 404. It should be noted that the bus portions $B_1'$, $B_2'$ can be located on the front or back of the circuit card 420. Likewise, the bus portions $B_1'$, $B_2'$ could be routed on the same side where the bus B was input into the connector 404 or on the opposite side of the connector 404.

The bus B is routed from the second connector 406 to the elements 432, 434, 436 using bus portions $B_1''$, $B_2''$, which reside on the motherboard M. The bus B is then routed from the elements 432, 434, 436 to a different portion (i.e., different pins) of the second connector 406 and then out of the connector 406. Bus portions $B_1'''$, $B_2'''$ are used to route the bus in a substantially vertical manner from the elements 432, 434, 436 to the second connector 406. It should be noted that the bus portions $B_1'''$, $B_2'''$ can be located on the front or back of the circuit card 430. Likewise, the bus portions $B_1'''$, $B_2'''$ could be routed on the same side where the bus B was input into the connector 406 or on the opposite side of the connector 406. The bus B is routed from the second connector 406 where it is terminated by termination resistors 408, 410. If there was a third connector and circuit card, the bus would be routed into and out of the third connector in a similar manner as described with respect to the first circuit card 420. If the system 400 contained a fourth connector and card, the bus B would be routed between the third and fourth connectors and out of the fourth connector in a similar manner as described with respect to the first and second cards 420, 430. The routing of the bus B would continue in the same manner for all other slots used in the system 400.

Figure 11:
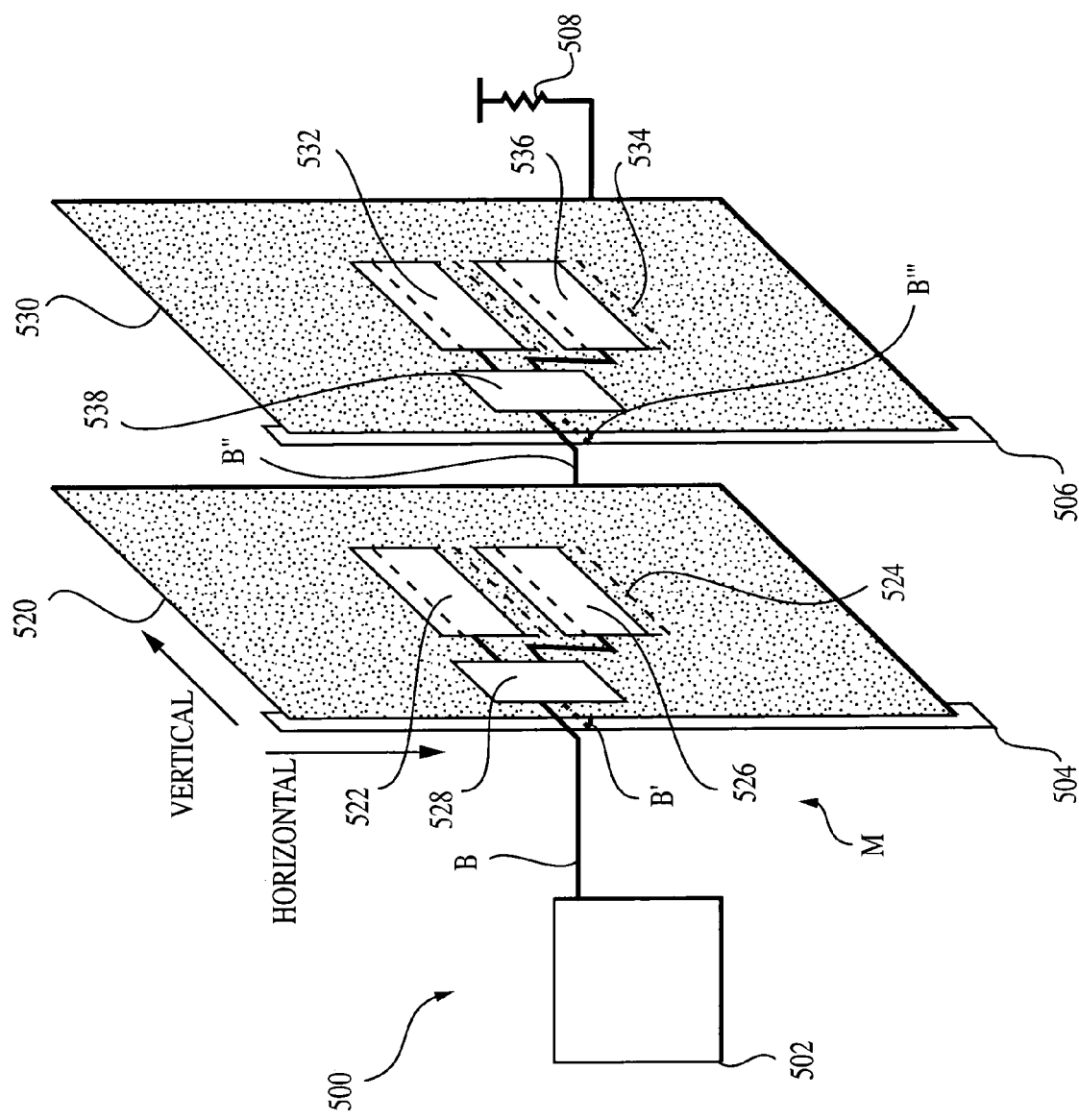
FIG. 11 is a diagram illustrating yet another exemplary high speed bus topology constructed in accordance with another embodiment of the present invention.

FIG. 11 illustrates another alternate embodiment of the present invention. This embodiment also uses a short-loop up/down topology. In keeping with the example used to described systems 10, 50 and 100 (FIGS. 1–3), the system 500 of the present embodiment will be described as a computer main memory subsystem. It should be noted that this is just an example and that the same system 500 is appropriate for any high-speed bus having removable circuit cards.

The system 500 includes two circuit cards 520, 530 that are attached to a bus B through connectors 504, 506, respectively. The system 500 is similar to the system 400 (illustrated in FIG. 4) with the exception that interface devices 528, 538 are provided on the circuit cards 520, 530, respectively. The interface devices 528, 538, are used to route the bus B into and out of the cards 520, 530. In addition, the interface devices 528, 538 will drive the elements 522, 524, 526, 532, 534, 536 by providing the appropriate bus signals to them. As such, the interface devices 528, 538 provide a mechanism for controlling the elements on the cards 520, 530, while also achieving the benefits of routing the bus B in a short-loop up/down manner (as described with reference to FIG. 10).

The bus B may carry, e.g., address, data, control, power and ground signals as well as any reference signals required by the system 500. The bus B may be a 16-bit bus. A memory controller 502 is connected to the bus B. The controller 502 and connectors 504, 506 reside on the computer motherboard M. With the exception of the bus portions routed through the cards 520, 530, designated as B', B''', the bus B is also provided on the motherboard M and is terminated by termination resistor 508. The system 500 does not require a jumper mechanism to route the bus B between the circuit cards 520, 530.

In accordance with this embodiment of the present invention, the bus B is routed into the first connector 404 to the first interface device 528. The first interface device 528 generates the appropriate signals to drive the circuit elements 522, 524, 526. The bus B is then routed from the interface device 528 to a different portion (i.e., different pins) of the first connector 504 and then out of the connector 504. Bus portion B' is used to route the bus B in a substantially vertical manner from the interface device 528 to the connector 504. It should be noted that the bus portion B' can be located on the front or back of the circuit card 520. Likewise, the bus portion B' could be routed on the same side where the bus B was input into the connector 504 or on the opposite side of the connector 504.

The bus B is routed from the second connector 506 to the second interface device 538. The second interface device 538 generates the appropriate signals to drive the circuit elements 532, 534, 523. The bus B is then routed from the second interface device 538 to a different portion (i.e., different pins) of the second connector 506 and then out of the connector 506. Bus portion B''' is used to route the bus B in a substantially vertical manner from the second interface device 538 to the second connector 506. It should be noted that the bus portion B''' can be located on the front or back of the circuit card 530. Likewise, the bus portion B"" could be routed on the same side where the bus B was input into the second connector 506 or on the opposite side of the connector 506. The bus B is routed from the second connector 506 where it is terminated by termination resistor 508. If there was a third connector and circuit card, the bus would be routed into and out of the third connector in a similar manner as described with respect to the first circuit card 520. If the system 500 contained a fourth connector and card, the bus B would be routed between the third and fourth connectors and out of the fourth connector in a similar manner as described with respect to the first and second cards 520, 530. The routing of the bus B would continue in the same manner for all other slots used in the system 500.

The novel topology of the present invention reduces bus stubs and minimizes bus length, which addresses many of the concerns for long buses mentioned above with reference to FIGS. 1 and 2. Thus, the present invention provides improvements in bandwidth and EMI when compared to the prior art stub bus and loop-through bus systems. There are, however, other advantages provided by the present invention. For example, in the prior art loop-through bus system (FIG. 2), the bus width and thus, the number of bus signals, must be reduced due to the physical limitations of the expansion connectors and the routing congestion of the bus along the width of the expansion cards. Since there are only two connection points for the bus lines in the topology of the present invention, the bus can contain more signals because the same connector does not have to be used for the bus exit point. Furthermore, routing the bus vertically reduces bus congestion for our example (i.e., a short, wide memory card), since there is more space available in the width direction.

For a fixed number of memory devices on the bus, the topology of the present invention would favor having a wider bus with fewer devices attached to each signal as opposed to the loop-through system (FIG. 2). The current approach described herein results in less devices per signal and therefore, less capacitance per signal. The lower capacitance allows the bus to operate at higher frequencies. Moreover, since there are fewer devices attached to a signal line on a card, the populated section of the card will have less capacitance per unit length and a higher loaded impedance. The higher loaded impedance allows a larger termination resistor to be used, which decreases the power dissipation of the bus for a given voltage swing. Additionally, the higher loaded impedance allows narrower bus trace widths to be used in the unpopulated bus sections and a uniform impedance can be maintained. For example, the loaded impedance of the present invention can approach 40 ohms, whereas in the prior art systems it was approximately 25 to 30 ohms.

Figure 8:
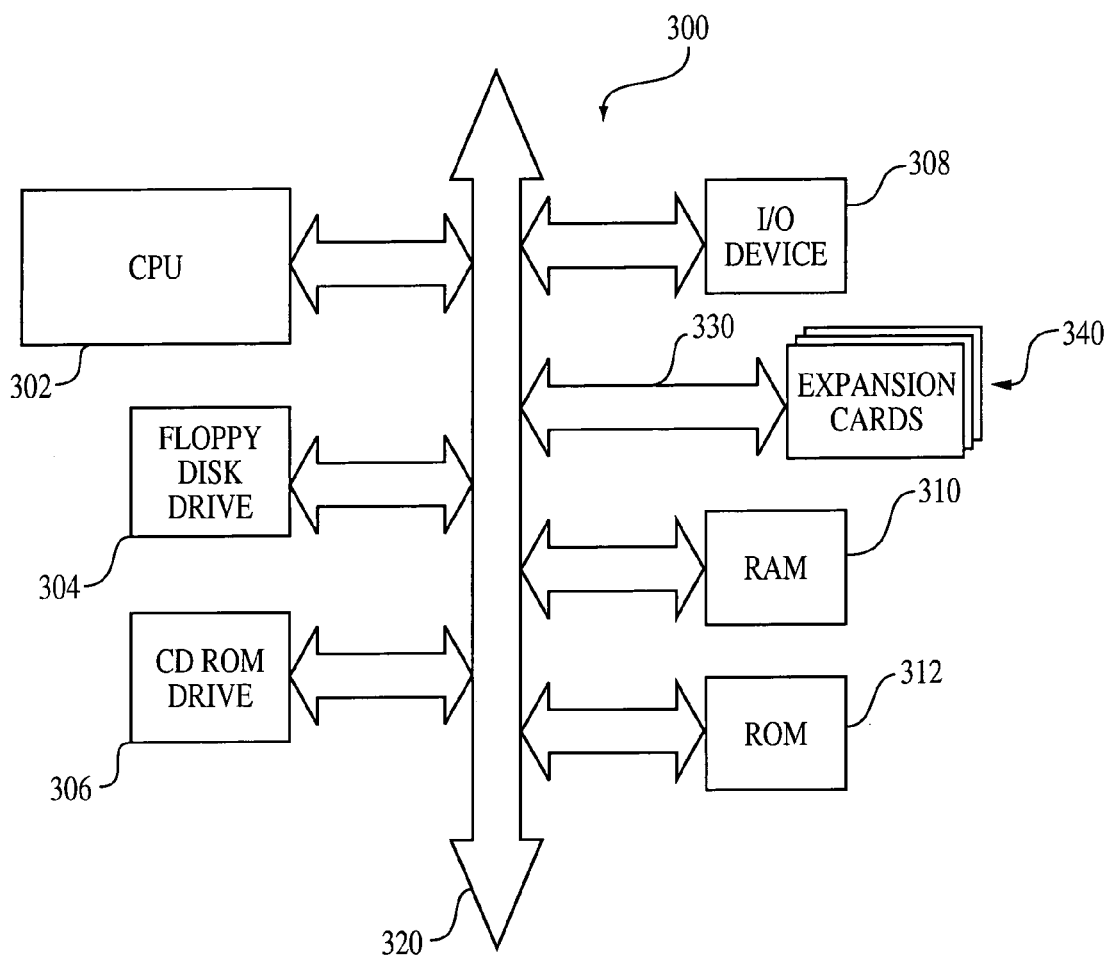
FIG. 8 is a block diagram illustrating a processor-based system implementing a high speed bus topology constructed in accordance with the present invention.

FIG. 8 illustrates a block diagram of a processor based system 300 utilizing expansion cards 340 and a short-loop bus topology 330 constructed in accordance with the present invention. The processor-based system 300 may be a computer system, a network switch or system, a process control system or any other system employing a processor and expansion cards 340. The system 300 includes a central processing unit (CPU) 302, e.g., a microprocessor, that communicates with a RAM memory circuit 310 and an I/O device 308 over a bus 320. It must be noted that the bus 320 may be a series of buses and bridges commonly used in a processor-based system, but for convenience purposes only, the bus 320 has been illustrated as a single bus. A second I/O device 308 is illustrated, but is not necessary to practice the invention. The processor-based system 300 also includes a read-only memory (ROM) circuit 312 and may include peripheral devices such as a floppy disk drive 304 and a compact disk (CD) ROM drive 306 that also communicates with the CPU 302 over the bus 320 as is well known in the art. It should be noted that the CPU 302 can be combined on a single chip with one or more RAM memory circuits 310 and ROM circuits 312.

The present invention has many possible applications and implementations that would not change the scope of the invention. Other application for the present invention but are not limited to main memory subsystems, graphic cards, input/output cards, peripheral cards, network cards, hubs and switches. The jumper mechanisms can be implemented as a PCB with connectors, a flexible cable, permanent bus attachments, coaxial lines, microstrip or stripline routing, reference planes used to maintain a uniform impedance, shield lines used to maintain a uniform impedance or to reduce signal crosstalk and the use of a reference plane on the jumper to reduce EMI. The jumper mechanism can contain connections for signals only and not power and ground connections, connections for signals and voltage references and bus connections in addition to unrelated signal connections for the purposes of card to card communication.

It should be appreciated that the circuit cards and modules can be configured in many ways also. For example, there can be connection points at the top and bottom of the cards, there can be connection points on the sides of the cards or at intermediate locations. The connectors used can be other than DIMM connectors. The connectors can be surface mount or through-hole type connectors.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of routing a system bus to a plurality of expansion cards, said method comprises the acts of:
   routing the bus into a first connector on a motherboard of the system and into a first circuit card residing within the first connector;
   routing the bus from a portion of the first circuit card into a portion of a second circuit card residing within a second connector on the motherboard, wherein the bus is routed from the first circuit card to the second circuit card without entering the second connector; and
   routing the bus through the second circuit card to the second connector.

2. The method of claim 1 further comprising the acts of:
   routing the bus into a third connector and into a third circuit card residing within the third connector;
   routing the bus from a portion of the third circuit card into a portion of a fourth circuit card residing within a fourth connector, wherein the bus is routed from the third circuit card to the fourth circuit card without entering the fourth connector;

routing the bus through the fourth circuit card to the fourth connector; and routing the bus out of the fourth connector.

3. The method of claim 1 further comprising the acts of:

routing the bus into a third connector and into a third circuit card residing within the third connector; and routing the bus from a portion of the third circuit card into a portion of the motherboard.

4. The method of claim 1 further comprising the act of routing the bus out of the second connector into a portion of the motherboard.

5. The method of claim 4 further comprising the act of terminating the bus after routing the bus out of the second connector.

6. The method of claim 1 wherein the first and second circuit cards each contain a top edge portion, each top edge portions being opposite an edge portion residing in a respective connector, and wherein the bus is routed from the top edge portion of the first circuit card into the top edge portion of the second circuit card.

7. The method of claim 1 wherein the first and second circuit cards each contain a top edge portion, each top edge portions being opposite a bottom edge portion residing in a respective connector, and wherein the bus is routed from a portion between the top and bottom edges of the first circuit card into a portion between the top and bottom edges of the second circuit card.

8. The method of claim 1 wherein said act of routing the bus from the portion of the first circuit card into the portion of the second circuit card comprises connecting the portion of the first circuit card to the portion of the second circuit card by a jumper mechanism.

9. The method of claim 1 wherein said act of routing the bus from the portion of the first circuit card into the portion of the second circuit card comprises connecting the portion of the first circuit card to the portion of the second circuit card by a circuit board having bus portion traces for continuing the bus between the first and second circuit cards.

10. The method of claim 1 wherein said act of routing the bus from the portion of the first circuit card into the portion of the second circuit card comprises connecting the portion of the first circuit card to the portion of the second circuit card by a cable.

11. The method of claim 1 wherein at least address, data and control signals are routed on said bus between the first and second circuit cards.

12. The method of claim 11 wherein only address, data and control signals are routed on said bus between the first and second circuit cards.

13. The method of claim 1 wherein address, data, control and power signals are routed on said bus between the first and second circuit cards.

14. A method of routing a system bus to a plurality of expansion cards provided on a motherboard of the system, said method comprises the acts of:

routing the bus into a first circuit card residing within a first slot on the motherboard;

routing the bus from a portion of the first circuit card into a portion of a second circuit card residing within a second slot on the motherboard, wherein the bus is routed from the first circuit card to the second circuit card without entering the second slot; and routing the bus through the second circuit card.

15. The method of claim 14 further comprising the acts of:

routing the bus into a third circuit card residing within a third slot;

routing the bus from a portion of the third circuit card into a portion of a fourth circuit card residing within a fourth slot, wherein the bus is routed from the third circuit card to the fourth circuit card without entering the fourth slot; and routing the bus through and out of the fourth circuit card.

16. The method of claim 14 further comprising the acts of:

routing the bus into a third circuit card residing within a third slot; and routing the bus from a portion of the third circuit card into a portion of the motherboard.

17. The method of claim 14 further comprising the act of routing the bus out of the second slot.

18. The method of claim 17 further comprising the act of terminating the bus after routing the bus near either or both ends of the bus.

19. The method of claim 14 wherein the first and second circuit cards each contain a top edge portion, each top edge portions being opposite an edge portion residing in a respective slot, and wherein the bus is routed from the top edge portion of the first circuit card into the top edge portion of the second circuit card.

20. The method of claim 14 wherein the first and second circuit cards each contain a top edge portion, each top edge portions being opposite a bottom edge portion residing in a respective slot, and wherein the bus is routed from a portion between the top and bottom edges of the first circuit card into a portion between the top and bottom edges of the second circuit card.

21. The method of claim 14 wherein said act of routing the bus from the portion of the first circuit card into the portion of the second circuit card comprises connecting the portion of the first circuit card to the portion of the second circuit card by a jumper mechanism.

22. The method of claim 14 wherein said act of routing the bus from the portion of the first circuit card into the portion of the second circuit card comprises connecting the portion of the first circuit card to the portion of the second circuit card by a circuit board having bus portion traces for continuing the bus between the first and second circuit cards.

23. The method of claim 14 wherein said act of routing the bus from the portion of the first circuit card into the portion of the second circuit card comprises connecting the portion of the first circuit card to the portion of the second circuit card by a cable.

24. The method of claim 14 wherein at least address, data and control signals are routed between the first and second circuit cards.

25. The method of claim 24 wherein only address, data and control signals are routed on said bus between the first and second circuit cards.

26. The method of claim 14 wherein address, data, control and power signals are routed on said bus between the first and second circuit cards.

27. The method of claim 14 wherein the bus is routed into the first circuit card by routing the bus into a first connector in which the first circuit card is residing.

28. The method of claim 14 wherein the bus is routed out of the second circuit card by routing the bus out into a second connector in which the second circuit card is residing.

29. The method of claim 14 wherein a first portion of bus signals are routed between the first and second circuit cards and a second portion of bus signals are provided to the second circuit card from the motherboard.

30. A bus system comprising:
   a bus mounted on a circuit board of said system; and
   a plurality of expansion slots, each slot comprising a connector mounted on said circuit board and a circuit card residing within the connectors wherein said bus is routed into a first connector, into a first circuit card residing within said first connector, out of a portion of said first circuit card into a portion of a second circuit card residing within a second connector and through said second circuit card, and wherein said bus is routed from said first circuit card to said second circuit card without entering said second connector.

31. The system of claim 30 further comprising:
   a third connector having a third circuit card residing therein; and
   a fourth connector having a fourth circuit card residing therein, wherein said bus is further routed into said third connector to said third circuit card, out of a portion of said third circuit card into a portion of said fourth circuit, through said fourth circuit card and out of said fourth connector, and wherein said bus is routed from said third circuit card to said fourth circuit card without entering said fourth connector.

32. The system of claim 30 further comprising a third connector having a third circuit card residing therein, wherein said bus is further routed into said third connector to said third circuit card, out of a portion of said third circuit card and into a portion of said system circuit board.

33. The system of claim 30 wherein said bus is terminated by a plurality of resistors.

34. The system of claim 30 further comprising a jumper mechanism connected between said portions of said first and second circuit cards, said jumper mechanism for routing said bus between said first and second circuit cards.

35. The system of claim 34 wherein said portions are located at a top edge of said first and second circuit cards opposite a bottom edge residing in said connectors.

36. The system of claim 34 wherein said first and second circuit cards each contain a top edge portion, each top edge portions being opposite a bottom edge portion residing in a respective connector, and wherein said bus is routed from a portion between said top and bottom edges of said first circuit card into a portion between said top and bottom edges of said second circuit card.

37. The system of claim 34 wherein said jumper mechanism comprises:
   a circuit board having bus portion traces configured for continuing said bus between said first and second circuit cards; and
   a plurality of connectors coupled to said circuit board, at least one connector adapted to receive said portion of said first circuit card and at least one other connector adapted to receive said portion of said second circuit card.

38. The system of claim 34 wherein said jumper mechanism comprises:
   a cable configured for continuing said bus between said first and second circuit cards; and
   a plurality of connectors coupled to said cable, at least one connector adapted to receive said portion of said first circuit card and at least one other connector adapted to receive said portion of said second circuit card.

39. The system of claim 38 wherein said cable is a ribbon cable.

40. The system of claim 38 wherein said cable is a ribbon cable with a shield.

41. The system of claim 38 wherein said cable is a coaxial cable.

42. The system of claim 38 wherein said cable is a twisted pair wiring.

43. The system of claim 38 wherein said cable is a waveguide.

44. The system of claim 30 wherein said circuit cards are dynamic random access memory circuit cards and said system further comprises a memory controller coupled to said bus.

45. A bus system comprising:
   a bus mounted on a circuit board of said system; and
   a plurality of expansion slots mounted on said circuit board, wherein said bus is routed into a first circuit card residing within a first slot, out of a portion of said first circuit card and into a portion of a second circuit card residing within a second slot and out of the second circuit card, wherein said bus is routed from said first circuit card to said second circuit card without entering said second slot.

46. The system of claim 45 further comprising:
   a third slot having a third circuit card residing therein; and
   a fourth slot having a fourth circuit card residing therein, wherein said bus is further routed into said third circuit card, out of a portion of said third circuit card and into a portion of said fourth circuit, and out of said fourth circuit card, wherein said bus is routed from said third circuit card to said fourth circuit card without entering said fourth slot.

47. The system of claim 45 further comprising a third slot having a third circuit card residing therein, wherein said bus is further routed into said third circuit card, out of a portion of said third circuit card and into a portion of said system circuit board.

48. The system of claim 45 wherein said bus is terminated by a plurality of resistors.

49. The system of claim 45 further comprising a jumper mechanism connected between said portions of said first and second circuit cards, said jumper mechanism for routing said bus between said first and second circuit cards.

50. The system of claim 49 wherein said portions are located at a top edge of said first and second circuit cards, said top edges being opposite respective bottom edges residing in associated slots.

51. The system of claim 49 wherein said portions are located between top and bottom edges of said cards, said top edges are opposite respective ones of said bottom edges, said bottom edges residing with a respect slot.

52. The system of claim 49 wherein said jumper mechanism comprises:
   a circuit board having bus portion traces configured for continuing said bus between said first and second circuit cards; and
   a plurality of connectors coupled to said circuit board, at least one connector adapted to receive said portion of said first circuit card and at least one other connector adapted to receive said portion of said second circuit card.

53. The system of claim 49 wherein said jumper mechanism comprises:
   a cable configured for continuing said bus between said first and second circuit cards; and
   a plurality of connectors coupled to said cable, at least one connector adapted to receive said portion of said first circuit card and at least one other connector adapted to receive said portion of said second circuit card.

54. The system of claim 53 wherein said cable is a ribbon cable.

55. The system of claim 53 wherein said cable is a ribbon cable with a shield.

56. The system of claim 53 wherein said cable is a coaxial cable.

57. The system of claim 53 wherein said cable is a twisted pair wiring.

58. The system of claim 53 wherein said cable is a waveguide.

59. The system of claim 45 wherein said circuit cards are dynamic random access memory circuit cards and said system further comprises a memory controller coupled to said bus.

60. A processor-based system comprising:

a processor; and a bus system coupled to said processor; said bus system comprising:

a bus mounted on a circuit board of said system; and a plurality of expansion slots, each slot comprising a connector mounted on said circuit board and a circuit card residing within the connector, wherein said bus is routed into a first connector, into a first circuit card residing within said first connector, out of a portion of said first circuit card into a portion of a second circuit card residing within a second connector, through said second circuit card and out of said second connector, wherein said bus is routed from said first circuit card into said second circuit card without entering said second connector.

61. A processor-based system comprising:

a processor; and a bus system coupled to said processor; said bus system comprising:

a bus mounted on a circuit board of said system; and a plurality of expansion slots mounted on said circuit board, wherein said bus is routed into a first circuit card residing within a first slot, out of a portion of said first circuit card and into a portion of a second circuit card residing within a second slot and out of the second circuit card, wherein said bus is routed from said first circuit card into said second circuit card without entering said second slot.

62. A processor-based system comprising:

a processor; and a memory bus system coupled to said processor; said bus system comprising:

a bus mounted on a circuit board of said system; and a plurality of expansion slots mounted on said circuit board, wherein said bus is routed into a first memory circuit card residing within a first slot, out of a portion of said first memory circuit card and into a portion of a second memory circuit card residing within a second slot, and out of the second memory circuit card, wherein said bus is routed from said first memory circuit card into said second memory circuit card without entering said second slot.

* * * * *

UNITED STATES PATENT AND TRADEMARK OFFICE
CERTIFICATE OF CORRECTION

PATENT NO. : 6,963,941 B1
DATED : November 8, 2005
INVENTOR(S) : Terry R. Lee

It is certified that error appears in the above-identified patent and that said Letters Patent is hereby corrected as shown below:

Column 3,
Line 47, "effected." should read -- affected. --;

Column 6,
Line 31, "describes" should read -- described --;
Line 49, "$B_2$'"'" should read -- $B_2$'"' --;

Column 9,
Line 63, "$B_2$'"'" should read -- $B_2$'"' --;

Column 12,
Line 14, "application" should read -- applications --;
Line 14, "invention but are" should read -- invention are --;

Column 13,
Lines 20 and 26, "portions" should read -- portion --;

Column 14,
Lines 22 and 28, "portions" should read -- portion --; and

Column 15,
Line 42, "portions" should read -- portion --.

Signed and Sealed this

Fourth Day of April, 2006

JON W. DUDAS
*Director of the United States Patent and Trademark Office*